(12) United States Patent
Hashimoto

(10) Patent No.: US 7,755,261 B2
(45) Date of Patent: Jul. 13, 2010

(54) ELECTRONIC COMPONENT, MOUNTING STRUCTURE THEREOF, AND METHOD FOR MOUNTING ELECTRONIC COMPONENT

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 4 days.

(21) Appl. No.: 12/206,807

(22) Filed: Sep. 9, 2008

(65) Prior Publication Data

US 2009/0102323 A1   Apr. 23, 2009

(30) Foreign Application Priority Data

Oct. 19, 2007  (JP)  ............................ 2007-272532
Feb. 18, 2008  (JP)  ............................ 2008-036715

(51) Int. Cl.
*H01L 41/09* (2006.01)
(52) U.S. Cl. ..................................... 310/370
(58) Field of Classification Search ................ 310/330, 310/332, 370, 348, 351, 367, 365, 366, 345; 257/738, 737; 331/158; 438/613, 314; H01L 41/09, H01L 41/08
See application file for complete search history.

(56) References Cited

U.S. PATENT DOCUMENTS 5,925,930 A * 7/1999 Farnworth et al. .......... 257/737

7,122,896 B2 * 10/2006 Saito et al. ................... 257/738
7,666,777 B2 * 2/2010 Bauer et al. .......... 257/E23.021

FOREIGN PATENT DOCUMENTS

| JP | 05-174618 | 7/1993 |
|---|---|---|
| JP | 10-173006 | 6/1998 |
| JP | 11-261360 | 9/1999 |
| JP | 2004-328335 | 11/2004 |
| JP | 2006-284373 | 10/2006 |
| JP | 2007-013444 | 1/2007 |
| JP | 2007-180166 | 7/2007 |

\* cited by examiner

*Primary Examiner*—Walter Benson
*Assistant Examiner*—Karen B Addison
(74) *Attorney, Agent, or Firm*—Harness, Dickey & Pierce, P.L.C.

(57) ABSTRACT

An electronic component includes: a functional piece having a predetermined function; a bump electrode formed on the functional piece, the bump electrode including a core with elastic property and a conductive film provided on a surface of the core; and a holding unit for holding a conductive contact state between the bump electrode and a connecting electrode which is electrically conducted to a driving circuit. The electronic component is coupled to the connecting electrode, and elastic deformation of the core causes the conductive film to make conductive contact with the connecting electrode.

20 Claims, 8 Drawing Sheets

ELECTRONIC COMPONENT, MOUNTING STRUCTURE THEREOF, AND METHOD FOR MOUNTING ELECTRONIC COMPONENT

BACKGROUND

1. Technical Field

The present invention relates to an electronic component such as a quartz crystal resonator, and a mounting structure thereof, as well as to a method for mounting the electronic component.

2. Related Art

In packages that include piezoelectric devices (electronic components) such as quartz crystal resonators, excitation electrodes provided to the quartz crystal resonators are fixed to connecting electrodes for coupling driving circuits that drive the quartz crystal resonators, so as to make conductive contact between the excitation electrodes and contact electrodes via a conductive paste such as solder (refer to JP-A-11-261360 for an example).

Such quartz crystal resonators however include the following problems. The contact area between the excitation electrodes and the connecting electrodes decreases if concaves and convexes are provided on the surface of the connecting electrodes. Moreover, the connection reliability between the quartz crystal resonators and the connecting electrodes needs to improve in order for the packages to cope with impacts such as a drop impact.

SUMMARY

An advantage of the invention is to provide an electronic component that improves the connection reliability between the electronic component and the connecting electrode, and a mounting structure of the electronic component, as well as a method for mounting the electronic component.

In order to solve the above problems, aspects of the invention are provided as follows. According to a first aspect of the invention, an electronic component includes: a functional piece having a predetermined function; a bump electrode formed on the functional piece, the bump electrode including a core with elastic property and a conductive film provided on a surface of the core; and a holding unit for holding a conductive contact state between the bump electrode and a connecting electrode which is electrically conducted to a driving circuit. The electronic component is coupled to the connecting electrode, and elastic deformation of the core causes the conductive film to make conductive contact with the connecting electrode.

In this aspect, even if the connecting electrode has convexes, the elastic deformation of the core achieves a desirable conductive contact between the conductive film and the connecting electrode with a sufficient contact area. Further, the holding unit holds the conductive contact between the conductive film and the connecting electrode, thereby providing a high connection reliability therebetween.

In other words, when the bump electrode is pressed against the connecting electrode during the mounting of the electronic component, the core elastically deforms so as to follow the surface shape of the connecting electrode. This causes the conductive film formed on the surface of the core to deform as well, following the surface shape of the connecting electrode. Consequently, the contact area of the conductive film and the connecting electrode increases, and the contact state therebetween is held by the holding unit, thereby improving their connection reliability. Here, even if a contact position between the bump electrode and the connection electrode receives impacts, such impacts are absorbed by the elastic deformation of the bump electrode. This provides high impact resistance at the contact position of the bump electrode and the connecting electrode.

Moreover, forming the holding unit and the bump electrode with a different material allows for selecting the optimal material for each. Thus, high connection reliability is obtained between the bump electrode and the connecting electrode.

In this case, supporting the functional piece in cantilever fashion may suitably be employed.

Since only one side is constrained in the above structure, the mechanical freedom of the functional piece increases, allowing to keep the energy loss such as leak and vibration loss to a minimum.

It is preferable that the functional piece be supported in cantilever fashion in a vicinity of a conductive contact region between the conductive film and the connecting electrode.

Even if the thermal expansion coefficient of the functional piece differs from that of members such as a substrate that includes the connecting electrode, this one side coupling transmits less thermal stress to the connecting unit and to the quartz crystal piece, compared to surface coupling or double-end coupling. Therefore, the connection lifetime is extended, and the reliability of the electronic component increases, while preventing the generation of unwanted heat stress in the members such as the substrate. Further, it is possible to reduce the effect of the stress caused by the mechanical or thermal deformation to be transmitted to the functional piece through the connecting unit.

It is preferable that the functional piece be supported in cantilever fashion at a node of vibration.

Consequently, the vibration of the functional piece does not attenuate at a support, and Q-factor (converting efficiency) of electric-mechanical vibration is improved.

In this case, the functional piece may constitute a piezoelectric device which is displaced by energizing the conductive film.

Moreover, the functional piece may be a quartz crystal piece.

In this case, the quartz crystal piece used as the functional piece constitutes a quartz crystal resonator.

Further, the holding unit may be an adhesive layer.

Adhering the conductive film and the connecting electrode with the adhesive layer holds the conductive contact therebetween.

Still further, the adhesive layer may cover the conductive film.

Here, when the bump electrode is pressed against the connecting electrode during the mounting of the electronic component, the adhesive layer is pushed out so that the conductive film makes conductive contact with the connecting electrode.

It is preferable that part of the conductive film be exposed out of the adhesive layer.

At this time, the conductive layer is exposed out of the conductive film so that the conductive film easily makes conductive contact with the connecting electrode, without pushing the adhesive layer. Therefore, the connection reliability of the conductive film and the connecting electrode further improves.

It is preferable that the adhesive layer be spaced from the conductive film.

Here, since the adhesive layer is spaced from the conductive film, the conductive film easily makes, similar to the above, conductive contact with the connecting electrode when the bump electrode is pressed against the connecting electrode during the mounting of the electronic component.

Therefore, the connection reliability of the conductive film and the connecting electrode further improves.

According to a second aspect of the invention, a mounting structure of an electronic component includes the electronic component described above and a substrate having the connecting electrode. In the structure, the electronic component is mounted on the substrate.

According to a third aspect of the invention, a method for mounting an electronic component includes mounting the electronic component described above to a substrate having the connecting electrode.

This provides high impact resistance at the contact position of the bump electrode and the connecting electrode. Forming the holding unit and the bump electrode with a different material allows for selecting the optimal material for each, thereby achieving high connection reliability of the bump electrode and the connection electrode. Moreover, supporting the functional piece in cantilever fashion increases the mechanical freedom of the functional piece, keeping the energy loss such as leak and vibration loss to a minimum. At the same time, the connection lifetime is extended, and the reliability of the electronic component improves, while the generation of unwanted heat stress is prevented in members such as a substrate, thereby reducing the effect of stress which is caused by mechanical deformation and heat deformation to be transmitted to the functional piece through the connecting unit.

The electronic component according to aspects of the invention realizes a predetermined function by the electromagnetic effect, and includes a piezoelectric device and a magnetostrictive device, displacement thereof such as a vibration being generated from the effect of electric power or magnetic power respectively.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
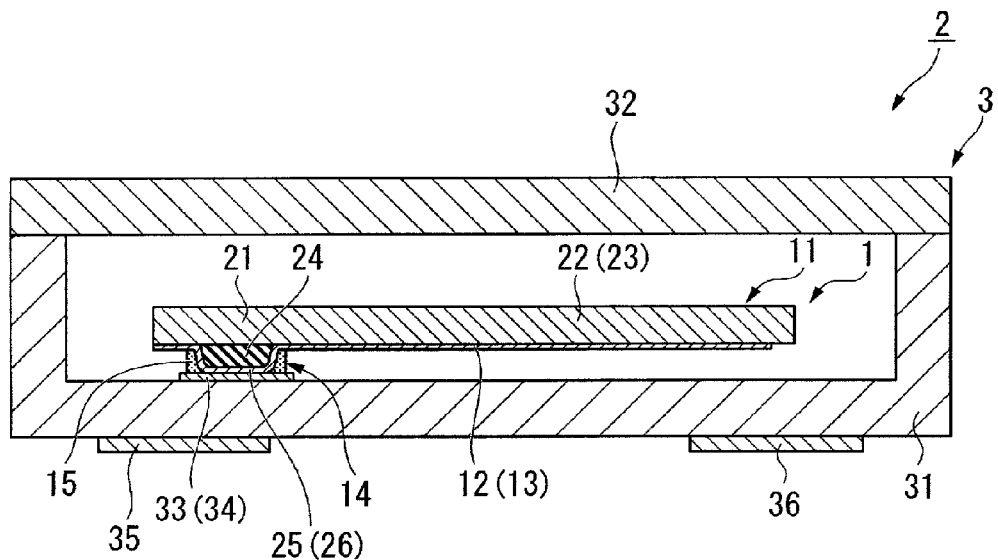
FIG. 1 is a sectional view illustrating a package of a quartz crystal resonator according to one embodiment.
Figure 2:
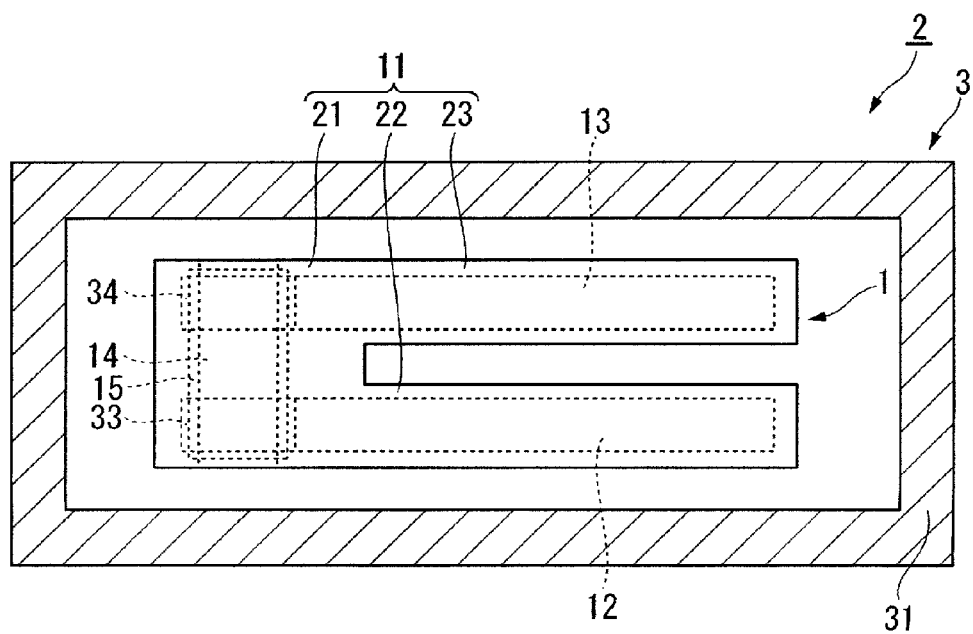
FIG. 2 is a plan view of FIG. 1.

A first embodiment of an electronic component according to aspects of the invention will now be described based on drawings. The following figures used in the descriptions below have different scale sizes modified for each of the components, so that each of them will be sufficiently large to be recognized. Here, FIG. 1 is a sectional view illustrating a quartz crystal resonator package that includes a quartz crystal resonator. FIG. 2 is a plan view of FIG. 1, and FIG. 3 is a perspective view illustrating the quartz crystal resonator.

A quartz crystal resonator package 2 including a quartz crystal resonator (piezoelectric device) 1 as an electronic component according to aspects of the invention will now be described. The quartz crystal resonator package 2 includes, as illustrated in FIGS. 1 and 2, the quartz crystal resonator 1 and a housing 3 for sealing the quartz crystal resonator 1.

Figure 3:
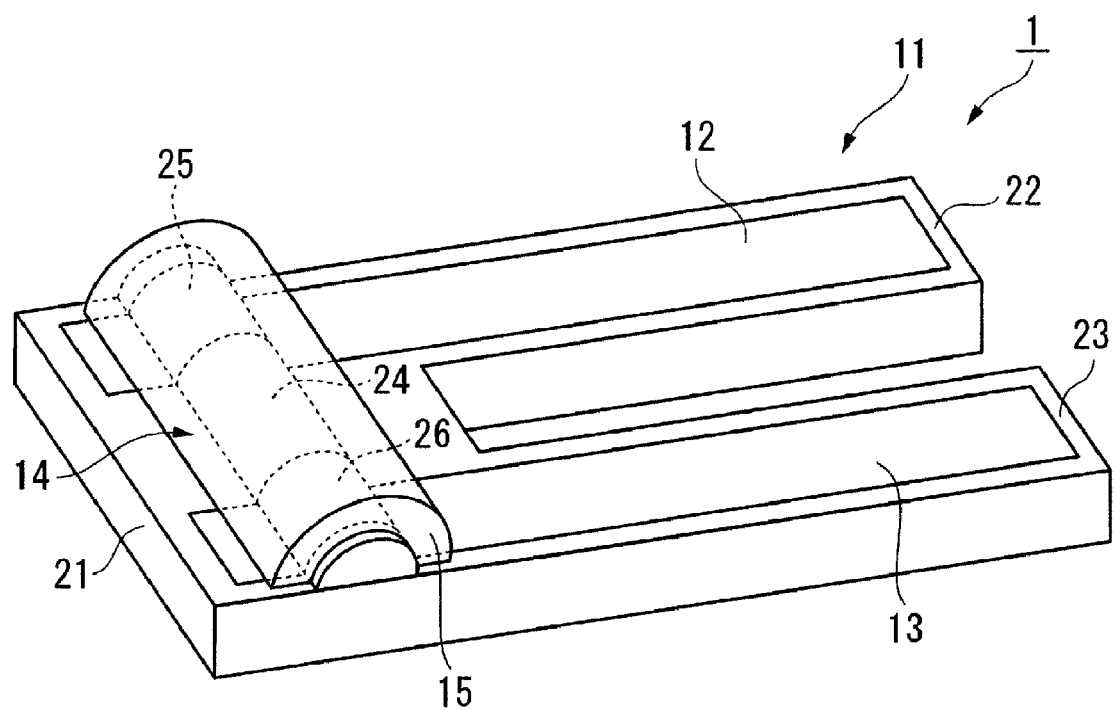
FIG. 3 is a perspective view illustrating the quartz crystal resonator.

As shown in FIGS. 1 to 3, the quartz crystal resonator 1 includes a quartz crystal piece (functional piece) 11, a pair of excitation electrodes 12 and 13 for exciting the quartz crystal piece 11, a bump electrode 14, and an adhesive layer (holding unit) 15.

The quartz crystal piece 11 is a plate member which is U-shaped in plan view, and has a planar shape of turning fork in which two arms 22 and 23 extends from a base 21 in the same direction in parallel.

The pair of excitation electrodes 12 and 13 is formed with, for instance, a conductive material such as aluminum (Al), and is formed on one side of the quartz crystal piece 11. The excitation electrode 12 is formed, extending from the base 21 to the arm 22, on one side (in FIG. 1, the bottom surface) of the quartz crystal piece 11. The excitation electrode 13 is formed, extending from the base 21 to the arm 23, on one side of the quartz crystal piece 11.

The bump electrode 14 is formed on one side of the base 21. As shown in FIGS. 1 to 3, the bump electrode 14 includes a resin core (core) 24 and a pair of conductive films 25 and 26 formed on a surface of the resin core 24.

The resin core 24 is formed with photosensitive resin or thermosetting resin such as polyimide, acrylic, phenol, silicone, silicone-modified polyimide, and epoxy resins.

As shown in FIG. 3, the resin core 24 is, prior to mounting the quartz crystal resonator 1 to a housing body 31, formed approximately like a barrel vault and extends on one side of the base 21, in a direction approximately orthogonal to the direction in which the pair of arms 22 and 23 extends. Here, the "approximately a barrel vault shape" means a columnar shape in which the inner (bottom) surface that is in contact with the quartz crystal piece 11 is flat, and the outer surface that is not in contact therewith is curved. Examples of a cross-section surface of such a shape include approximately a half circle, approximately a half oval, and approximately a trapezoid.

After mounting the quartz crystal resonator 1 to the housing body 31, the quartz crystal resonator 1 pressing relative to the housing body 31 causes the resin core 24 to elastically deform, as shown in FIG. 1, following the surface shapes of connecting electrodes 33 and 34 described later.

Here, the resin core 24 is formed with techniques such as photolithography and etching, and the material (hardness) of the resin core 24 is optionally selected and designed in accordance with conditions such as the shapes of the connecting electrodes 33 and 34.

As shown in FIG. 3, the pair of conductive films 25 and 26 are formed on the surface of the resin core 24, with a space interposed therebetween. The pair of conductive films 25 and 26 is made of metals and alloys such as gold (Au), titanium tungsten (TiW), copper (Cu), chromium (Cr), nickel (Ni), Ti, W, nickel vanadium (NiV), Al, palladium (Pd), and lead-free solder, and may be either a single layer or a multilayer of these metals or alloys.

The conductive film 25 is formed continuously to the excitation electrode 12, so as to be electrically conducted thereto. As shown in FIG. 1, after mounting the quartz crystal resonator 1 to the housing body 31, the conductive film 25 deforms to follow the surface shape of the connecting electrode 33 due to the elastic deformation of the resin core 24, thereby making conductive contact with the connecting electrode 33.

The conductive film 26 is formed continuously to the excitation electrode 13, so as to be electrically conducted thereto. Moreover, after mounting the quartz crystal resonator 1 to the housing body 31, the conductive film 26 deforms to follow the surface shape of connecting electrode 34 due to the elastic deformation of the resin core 24, thereby making conductive contact with the connecting electrode 34.

Here, the conductive films 25 and 26 are patterned after the film deposition with, for instance, sputtering. Alternatively, the conductive films 25 and 26 may also be formed by forming an underlying film with methods such as sputtering and electroless plating and thereafter depositing an upper layer film with electroplating. Similar to the resin core 24, the material (hardness) of the conductive films 25 and 26 are optionally selected and designed in accordance with conditions such as the shapes of the connecting electrodes 33 and 34. However, it is preferable that the conductive films 25 and 26 be formed with Au that excels particularly in flatting property, since the resin core 24 elastically deforms to follow the shape of the connecting electrodes 33 and 34. Here, if the conductive films 25 and 26 have a multilayer structure, it is preferable that the outermost layer be formed with Au.

The adhesive layer 15 is formed with adhesives such as epoxy resin and acrylic resin as shown in FIGS. 1 to 3. The adhesive layer 15 surrounds the contact region of the conductive film 25 and the connecting electrode 33, as well as the contact region of the conductive film 26 and the connecting electrode 34. Moreover, prior to mounting the quartz crystal resonator 1 to the housing body 31, the adhesive layer 15 is coated so as to cover the surfaces of the conductive films 25 and 26, as shown in FIG. 3.

As shown in FIGS. 1 and 2, the quartz crystal resonator 1 (the quartz crystal piece 11) is supported to the housing 3 in a cantilever structure, only at the base 21 in a vicinity of the conductive contact regions (at the left side edge of the quartz crystal resonator 1 in FIGS. 1 and 2) in which the conductive films 25 and 26 makes conductive contact with the connecting electrodes 33 and 34.

In other words, based on the vibration characteristics of the quartz crystal piece 11, the conductive contact region is provided as a cantilever support in the quartz crystal resonator 1, at a node of vibration with the smallest amplitude during the vibration of the quartz crystal piece 11.

The housing 3 includes the housing body 31 and a lid 32 that covers the housing body 31.

The housing body 31 is formed approximately in a shape of a box, and is made of an insulating material such as ceramics. The connecting electrodes 33 and 34 are formed on the top surface of the bottom of the housing body 31. Terminal electrodes 35 and 36 that are to be mounted on an un-illustrated circuit board are formed on the back surface of the bottom of the housing body 31.

The connecting electrodes 33 and 34 are formed with conductive materials such as metals, in a structure of, for instance, Au film deposited on a Ni plated layer formed on a W film, and are coupled to the terminal electrodes 35 and 36 through an un-illustrated wiring formed on the housing body 31.

Similar to the housing body 31, the lid 32 is formed with an insulating material such as ceramics. The lid 32 is bonded to an opening of the housing body 31 with methods such as soldering, so as to seal the quartz crystal resonator 1 in a space formed between the housing body 31 and the lid 32.

Figure 4A:
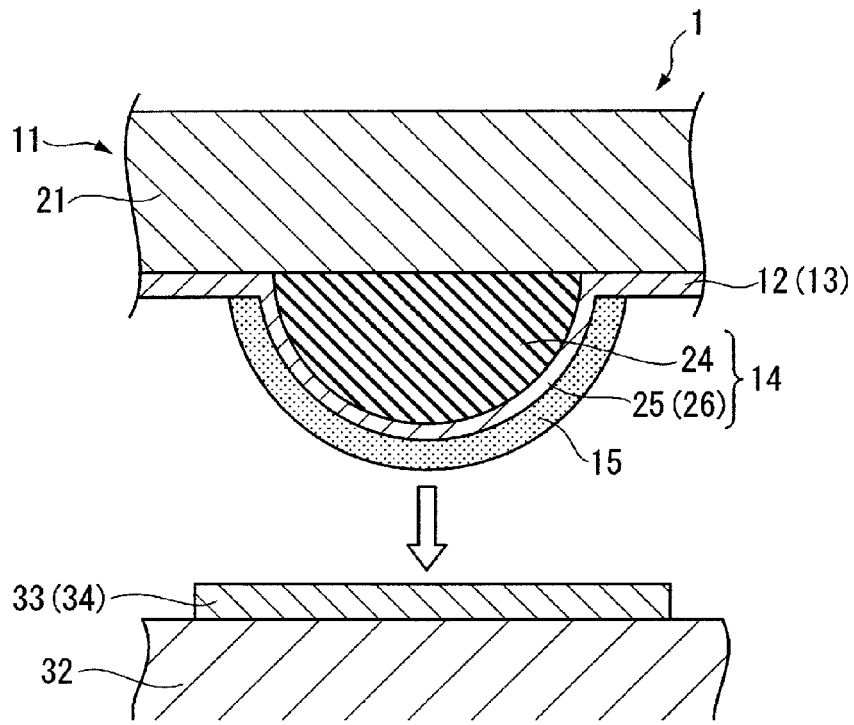
FIGS. 4A and 4B are process charts showing a mounting method of the quartz crystal resonator.
Figure 4B:
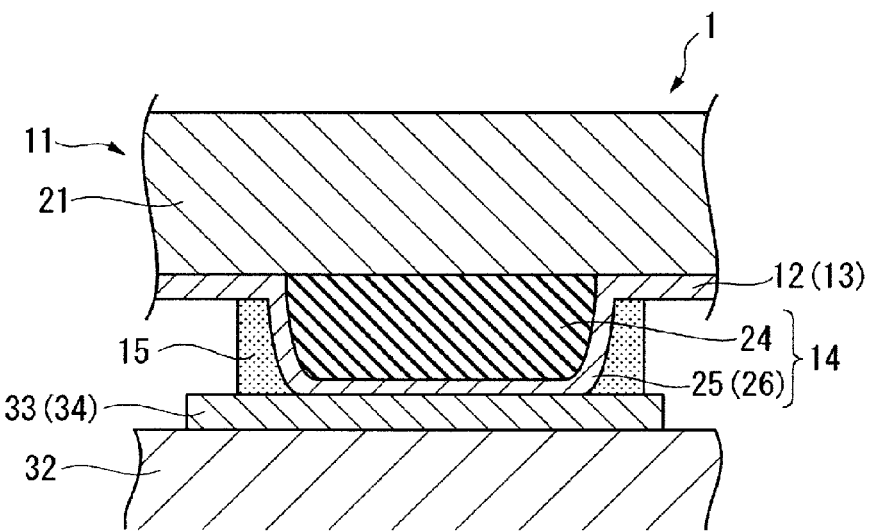

A method for mounting the quartz crystal resonator 1 will now be described with reference to FIGS. 4A and 4B. FIGS. 4A and 4B are sectional drawings illustrating the bump electrode 14 during the mounting of the quartz crystal resonator 1 to the housing body 31.

The bump electrode 14 installed on the quartz crystal resonator 1 is first made contact with and pressed to the connecting electrodes 33 and 34 formed on the housing body 31 (FIGS. 4A and 4B).

At this time, the resin core 24 elastically deforms and follows the shapes of the connecting electrodes 33 and 34.

The conductive film 25 then follows the surface shape of the connecting electrode 33 as the resin core 24 elastically deforms, and at the same time, the conductive film 26 also follows the surface shape of the connecting electrode 34. Thereafter, the adhesive layer 15 covering the conductive films 25 and 26 are pushed out along the outer surface of the resin core 24. Therefore, at least part of each of the conductive films 25 and 26 covered by the adhesive layer 15 is exposed out of the adhesive layer 15, and contacts the connecting electrodes 33 or 34. Consequently, the conductive films 25 and 26 make conductive contact with the connecting electrodes 33 and 34 with a sufficient contact area.

The adhesive layer 15 adheres the bump electrode 14 to the connecting electrodes 33 and 34, and the conductive contact state is held between the conductive film 25 and the connecting electrode 33, as well as between the conductive film 26 and the connecting electrode 34.

As described, the quartz crystal resonator 1 is mounted inside the housing body 31. Thereafter, the quartz crystal resonator 1 is sealed by bonding the housing body 31 and the lid 32 together. As a result, the quartz crystal resonator package 2 is formed.

Here, if the connecting unit of the quartz crystal resonator 1 and housing body 31 receives impact such as drop impact, the resin core 24 absorbs the impact by elastic deformation.

Moreover, the quartz crystal piece 11 of the quartz crystal resonator 1 is supported in a cantilever fashion at one place in the vicinity of the conductive contact regions in which the conductive films 25 and 26 make conductive contact with the connecting electrodes 33 and 34. Thus the mechanical freedom of the quartz crystal piece 11 increases at its end, allowing to keep the energy loss such as leak and vibration loss to a minimum. The quartz crystal resonator 1 is coupled with the housing body 31 only at one side. Thus, compared to surface coupling or double-end coupling, less thermal stress is transmitted to the connecting unit and to the quartz crystal piece 11, even if the thermal expansion coefficient of the quartz crystal resonator 1 (quartz crystal piece 11) differs from that of members such as the ones including the connecting electrodes 33 and 34. Therefore, the connection lifetime is extended, and the reliability of the electronic component increases, while preventing the generation of redundant heat stress in the members such as a substrate. Further, it is possible to reduce the effect of the stress caused by the mechanical or thermal deformation to be transmitted to the quartz crystal piece 11 through the connecting unit.

Moreover, the quartz crystal resonator 1 is supported in cantilever fashion at a node of vibration of the quartz crystal piece 11. This allows for suppressing the vibration attenuation at a support of the quartz crystal piece 11, as well as for improving Q-factor (converting efficiency) of electric-mechanical vibration.

Electronic Apparatus

Figure 5:
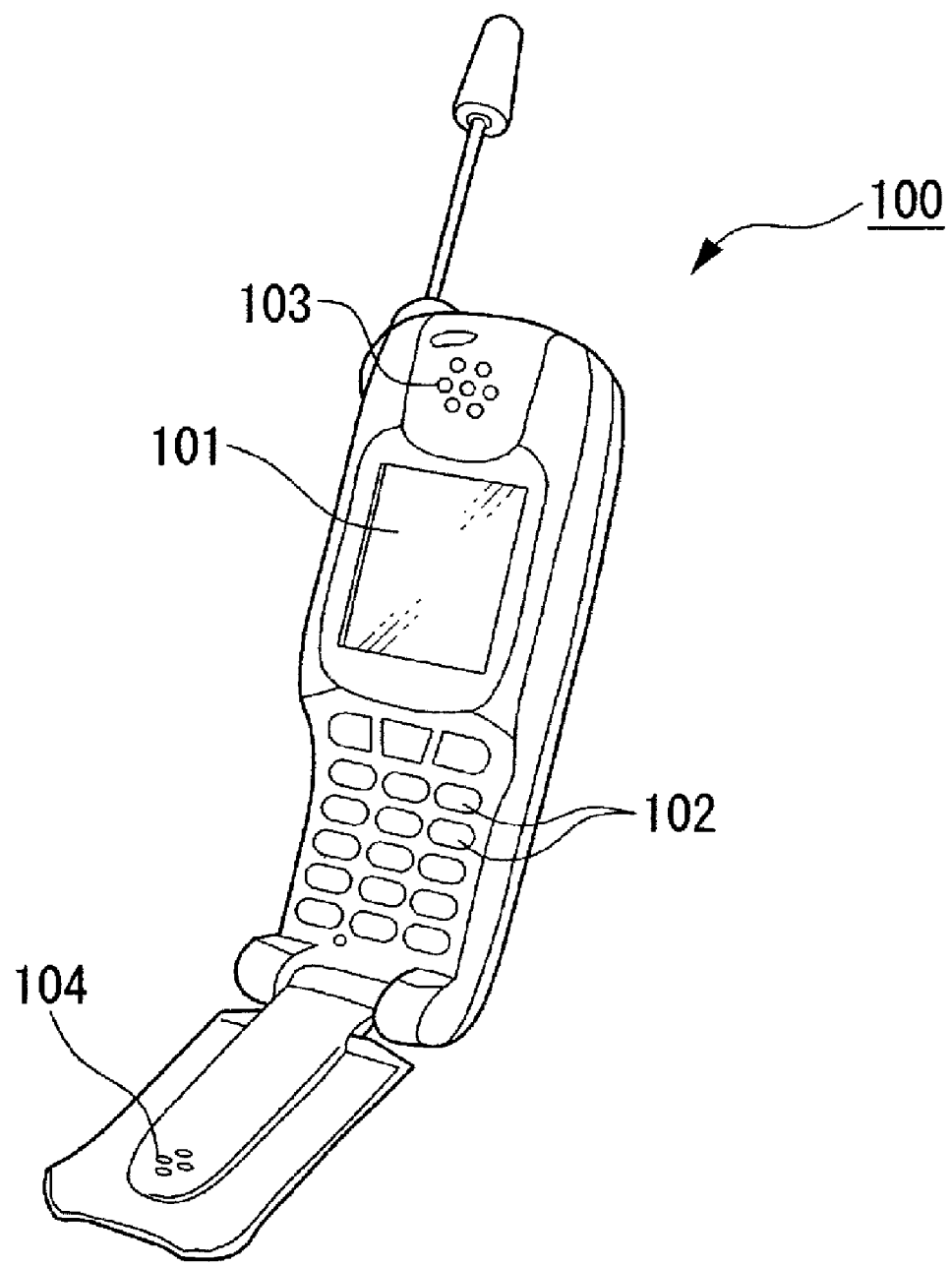
FIG. 5 is a perspective view illustrating a mobile phone including the quartz crystal resonator.

The quartz crystal resonator 1 is used, for instance, in a mobile phone 100 shown in FIG. 5. Here, FIG. 5 is a perspective view illustration the mobile phone 100.

This mobile phone 100 includes a display unit 101, a plurality of operation buttons 102, an earpiece 103, a mouthpiece 104, and a body that includes the display unit 101.

As described, according to the quartz crystal resonator 1 in the first embodiment, the elastic deformation of the resin core 24 achieves desirable conductive contact with sufficient contact areas between the conductive films 25 and 26 and the connecting electrodes 33 and 34. This conductive contact is held by the adhesive layer 15, and thus a high connection reliability is obtained therebetween.

Moreover, according to the quartz crystal resonator 1 in this embodiment, the mechanical freedom of the quartz crystal piece 11 increases at its end, allowing to keep the energy loss such as leak and vibration loss to a minimum. At the same time, thermal stress is not transmitted to the connecting unit nor to the quartz crystal piece 11, even if the thermal expansion coefficient of the quartz crystal resonator 1 (quartz crystal piece 11) differs from that of the members including the connecting electrodes 33 and 34. Consequently, the connection lifetime is extended and stability of the electronic component improves. Further, this embodiment does not generate excessive thermal stress in other members such as a substrate, thereby reducing the effect of the stress caused by the mechanical or thermal deformation to be transmitted to the quartz crystal piece 11 through the connecting unit.

Second Embodiment

Figure 6:
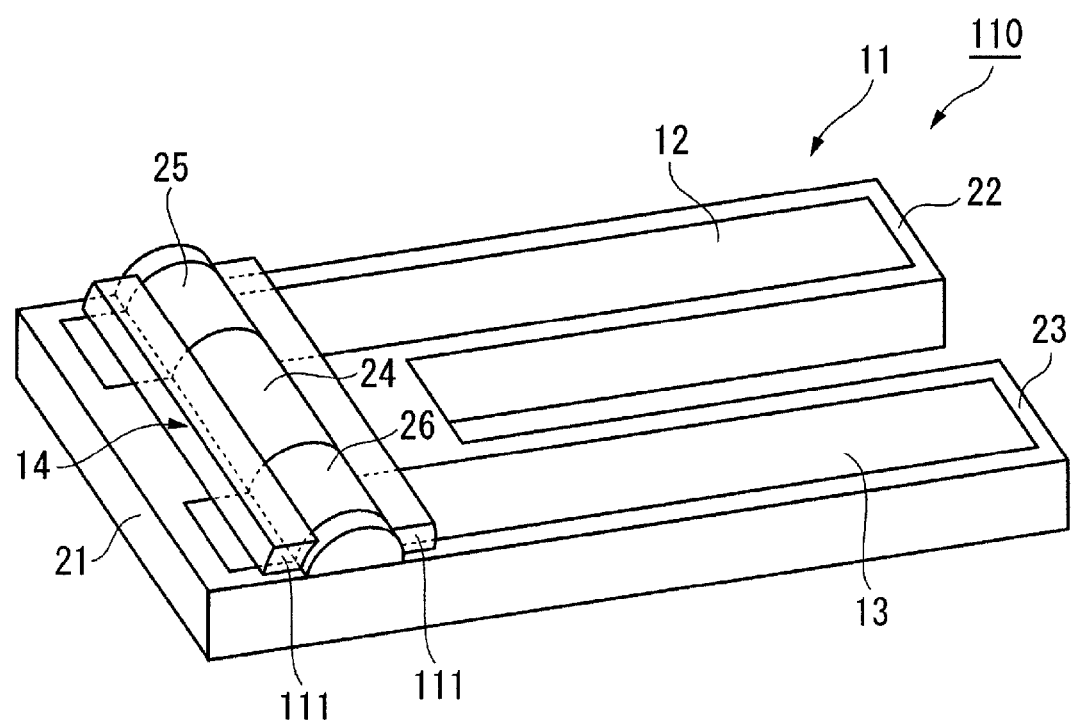
FIG. 6 is a perspective view illustrating a quartz crystal resonator according to another embodiment.
Figure 7A:
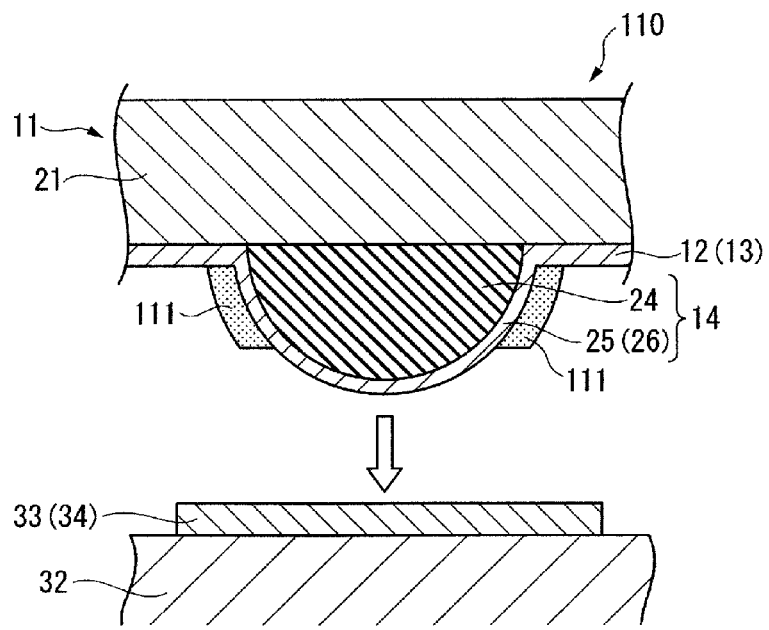
FIGS. 7A and 7B are process charts showing a mounting method of the quartz crystal resonator.
Figure 7B:
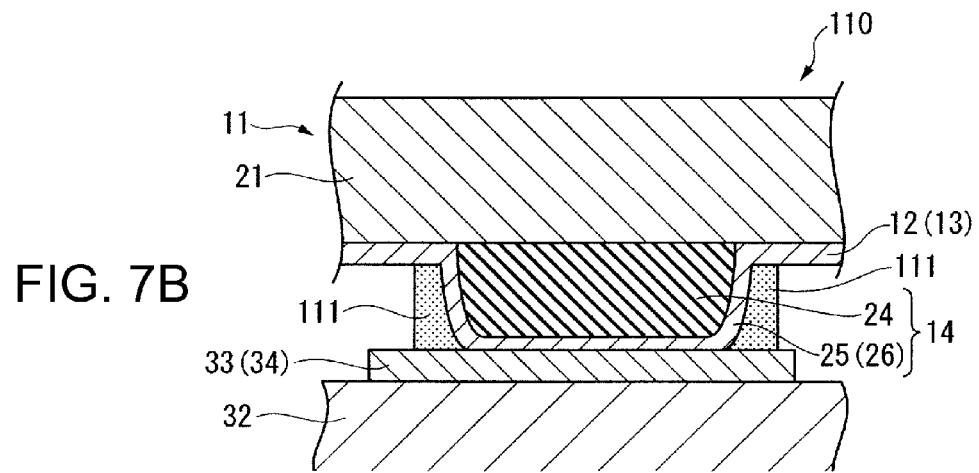

A second embodiment of a quartz crystal resonator according to aspects of the invention will now be described based on drawings. FIG. 6 is a perspective view illustrating the quartz crystal resonator before being mounted on the housing body, and FIGS. 7A and 7B are sectional drawings illustrating the bump electrode during the mounting of the quartz crystal resonator to the housing body. In this embodiment, the shape of the adhesive layer is different from that of the first embodiment. This difference will mainly be described, and elements described in the above embodiment are denoted by the same numerical symbols and descriptions thereof are omitted.

In quartz crystal resonator 110 according to this embodiment, prior to mounting the quartz crystal resonator 110 to the housing body 31, top parts of the conductive films 25 and 26 are exposed out of the adhesive layer 111 as shown in FIG. 6.

The bump electrode 14 installed on the quartz crystal resonator 110 is made contact with and pressed to the connecting electrodes 33 and 34 installed on the housing body 31 (FIGS. 7A and 7B).

At this time, the resin core 24 elastically deforms and follows the shapes of the connecting electrodes 33 and 34. The conductive film 25 then follows the shape of the connecting electrode 33 as the resin core 24 elastically deforms, and at the same time, the conductive film 26 also follows the shape of the connecting electrode 34. Here, since part of each of the conductive films 25 and 26 is exposed out of the adhesive layer 111, the conductive films 25 and 26 contact the connecting electrodes 33 and 34 when the bump electrode 14 contacts the connecting electrodes 33 and 34.

The adhesive layer 111 adheres the bump electrode 14 to the connecting electrodes 33 and 34, and the conductive contact state is held between the conductive film 25 and the connecting electrode 33, as well as between the conductive film 26 and the connecting electrode 34. Consequently, the quartz crystal resonator 110 is mounted inside the housing body 31.

As described, while the quartz crystal resonator 110 of the second embodiment works in a similar manner and exhibits similar effect as that of the first embodiment, the connection reliability is further improved between the conductive films 25 and the connecting electrode 33 as well as between the conductive films 26 and the connecting electrode 34 during the mounting, since part of each of the conductive films 25 and 26 is exposed out of the adhesive layer 111 in advance.

Third Embodiment

Figure 8:
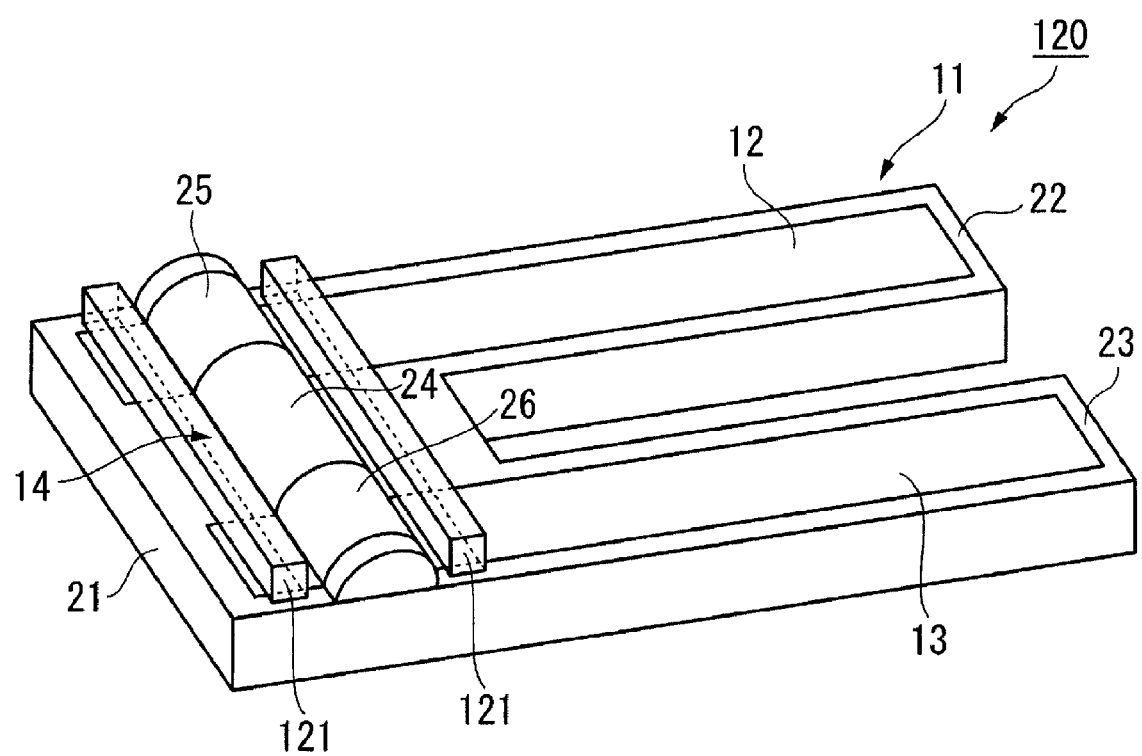
FIG. 8 is a perspective view illustrating a quartz crystal resonator according to still another embodiment.
Figure 9A:
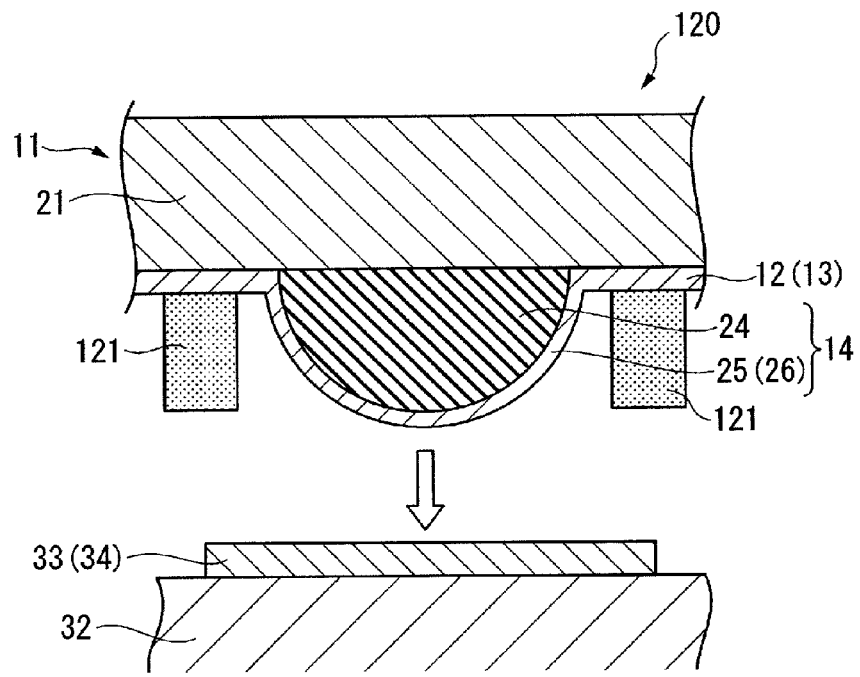
FIGS. 9A and 9B are process charts showing a mounting method of the quartz crystal resonator.
Figure 9B:
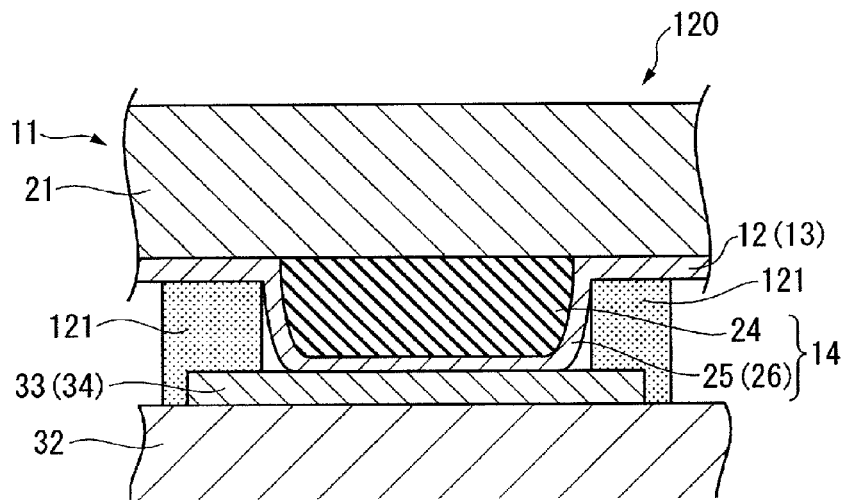

A third embodiment of a quartz crystal resonator according to aspects of the invention will now be described based on drawings. FIG. 8 is a perspective view illustrating the quartz crystal resonator before being mounted on the housing body, and FIGS. 9A and 9B are sectional drawings illustrating the bump electrode during the mounting of the quartz crystal resonator to the housing body. In this embodiment, the shape of the adhesive layer is different from that of the first embodiment, and this difference will mainly be described. Elements described in the above embodiments are denoted by the same numerical symbols and the descriptions thereof are omitted.

Prior to mounting a quartz crystal resonator 120 in this embodiment to the housing body 31, a pair of adhesive layers 121 is spaced from the conductive films 25 and 26 as shown in FIG. 8.

The pair of adhesive layers 121 is placed with the resin core 24 interposed therebetween, and is aligned in the direction orthogonal to the direction the resin core 24 extends, one on a side adjacent to the arms 22 and 23, and the other on a side spaced from the arms 22 and 23. The shape of each of the adhesive layers 121 is formed in a square pillar, and extends along the resin core 24 at a position spaced from the peripheries of the conductive films 25 and 26.

The bump electrode 14 installed on the quartz crystal resonator 120 is made contact with and pressed to the connecting electrodes 33 and 34 installed on the housing body 31 (FIGS. 9A and 9B).

At this time, the resin core 24 elastically deforms and follows the shapes of the connecting electrodes 33 and 34. The conductive film 25 then follows the shape of the connecting electrode 33 as the resin core 24 elastically deforms, and at the same time, the conductive film 26 also follows the shape of the connecting electrode 34. Here, the conductive films 25 and 26 are spaced from the adhesive layers 121 and thus contact the connecting electrodes 33 and 34 when the bump electrode 14 contacts the connecting electrodes 33 and 34.

The adhesive layer 121 adheres the bump electrode 14 to the connecting electrodes 33 and 34, and the conductive contact state is held between the conductive film 25 and the connecting electrode 33, as well as between the conductive film 26 and the connecting electrode 34. Consequently, the quartz crystal resonator 120 is mounted inside the housing body 31.

As described, the quartz crystal resonator 120 of the third embodiment also works in a similar manner and exhibits similar effect as that of the second embodiment.

In this embodiment, each of the adhesive layers 121 needs to be provided in a position spaced from the conductive films 25 and 26, and may have other shape such as a ring.

The present invention shall not be limited to the above-mentioned embodiments, and may allow various modifications without departing from the main scope of the present invention.

For instance, the shape of the resin core is not limited to a barrel vault, and may also be a trapezoid. Moreover, while one resin core is formed for two conductive films, two resin cores may be formed corresponding to the two conductive films. At this time, the resin core may take another shape such as a hemispheroid.

Further, the core may be formed with materials other than resin material, as long as the material is elastic.

In this embodiment, while descriptions of these embodiments refers to the usage of a turning fork quartz crystal resonator, the type of quartz crystal resonator is not limited thereto, and may include other quartz crystal resonators such as an AT-cut oscillator and a surface acoustic wave (SAW) oscillator. Further, while the quartz crystal resonator is formed using quartz piece as a functional piece, a piezoelectric device other than the quartz crystal resonator may be formed using other piezoelectric materials.

Still further, in the above embodiments, an example of the electronic component includes the piezoelectric device in which the displacement of the functional piece is caused by the electric power supplied. However, the electronic component is not limited thereto, and may include, for instance, a magnetostrictive device in which the displacement of the functional piece is caused by the magnetic power.

Moreover, the structure of the quartz crystal resonator and the piezoelectric device is not limited to a cantilever as described in the above embodiments, and may include other structures such as surface coupling and doubly clamped structures.

In the above embodiments, while the description is made for the examples in which quartz crystal resonator is mounted on the housing, the quartz crystal resonator may be mounted on a substrate on which a wiring pattern is formed. As described, the quartz crystal resonator is mounted on the housing body with the adhesive layer being provided to the quartz crystal resonator. Alternatively, the quartz crystal resonator may be mounted to the housing body in a state in which the adhesive layer is provided to the container body or a substrate, not by forming the bump electrode and providing the adhesive layer on the quartz crystal resonator as described in the embodiments.

The electronic component and the mounting structure thereof as well as the method for mounting the electronic component described in the above embodiments may be widely applied to micro-electro mechanical systems (MEMS) such as a mechanical component, a sensor, an actuator, and a device in which electronic circuits are integrated into a single silicon substrate (an inkjet printer head, a pressure sensor, an acceleration sensor, and a gyroscope).

What is claimed is:

1. An electronic component, comprising:
   a functional piece having a predetermined function;
   a bump electrode formed on the functional piece, the bump electrode including:
   a core with elastic property; and
   a conductive film provided on a surface of the core; and
   a holding unit for holding a conductive contact state between the bump electrode and a connecting electrode which is electrically conducted to a driving circuit,
   wherein the electronic component is coupled to the connecting electrode, and elastic deformation of the core causes the conductive film to make conductive contact with the connecting electrode,
   wherein the functional piece is supported in cantilever fashion.

2. The electronic component according to claim 1, wherein the functional piece is supported in cantilever fashion in a vicinity of a conductive contact region between the conductive film and the connecting electrode.

3. The electronic component according to claim 1, wherein the functional piece is supported in cantilever fashion at a node of vibration.

4. An electronic component, comprising:
   a functional piece having a predetermined function;
   a bump electrode formed on the functional piece, the bump electrode including:
   a core with elastic property; and
   a conductive film provided on a surface of the core; and
   a holding unit for holding a conductive contact state between the bump electrode and a connecting electrode which is electrically conducted to a driving circuit,
   wherein the electronic component is coupled to the connecting electrode, and elastic deformation of the core causes the conductive film to make conductive contact with the connecting electrode,
   wherein the functional piece constitutes a piezoelectric device which is displaced by energizing the conductive film.

5. The electronic component according to claim 4, wherein the functional piece is a quartz crystal piece.

6. The electronic component according to claim 1, wherein the holding unit is an adhesive layer.

7. The electronic component according to claim 6, wherein the adhesive layer covers the conductive film.

8. The electronic component according to claim 7, wherein part of the conductive film is exposed out of the adhesive layer.

9. The electronic component according to claim 6, wherein the adhesive layer is spaced from the conductive film.

10. A mounting structure of an electronic component, comprising:
    the electronic component according to claim 1; and
    a substrate having the connecting electrode,
    wherein the electronic component is mounted on the substrate.

11. A method for mounting an electronic component coupled to a connecting electrode which is electrically conducted to a driving circuit, the method comprising mounting the electronic component according claim 1 to a substrate having the connecting electrode.

12. The electronic component according to claim 4, wherein the holding unit is an adhesive layer.

13. The electronic component according to claim 12, wherein the adhesive layer covers the conductive film.

14. The electronic component according to claim 13, wherein part of the conductive film is exposed out of the adhesive layer.

15. The electronic component according to claim 12, wherein the adhesive layer is spaced from the conductive film.

16. A mounting structure of an electronic component, comprising:
    the electronic component according to claim 4; and
    a substrate having the connecting electrode,
    wherein the electronic component is mounted on the substrate.

17. A method for mounting an electronic component coupled to a connecting electrode which is electrically conducted to a driving circuit, the method comprising mounting the electronic component according claim 4 to a substrate having the connecting electrode.

18. The electrical component according to claim 4, wherein the functional piece is supported in cantilever fashion.

19. The electronic component according to claim 4, wherein the functional piece is supported in cantilever fashion in a vicinity of a conductive contact region between the conductive film and the connecting electrode or the functional piece is supported in cantilever fashion at a node of vibration.

20. The electronic component according to claim 1, wherein the functional piece constitutes a piezoelectric device which is displaced by energizing the conductive film.

* * * * *